United States Patent
Sagar et al.

(10) Patent No.: US 12,412,018 B2
(45) Date of Patent: Sep. 9, 2025

(54) UHD HDR IP CLIENT DEVICE PCB DESIGN LAYOUT

(71) Applicant: ARRIS Enterprises LLC, Suwanee, GA (US)

(72) Inventors: Robert Sagar, West Yorkshire (GB); James Anderson, Suwanee, GA (US); Brian M. Carroll, Quakertown, PA (US); Ian Clarke, Shipley (GB); Qiang Bai, Shipley (GB)

(73) Assignee: ARRIS ENTERPRISES LLC, Horsham, PA (US)

( * ) Notice: Subject to any disclaimer, the term of this patent is extended or adjusted under 35 U.S.C. 154(b) by 825 days.

(21) Appl. No.: 17/669,764

(22) Filed: Feb. 11, 2022

(65) Prior Publication Data

US 2022/0343050 A1   Oct. 27, 2022

Related U.S. Application Data (60) Provisional application No. 63/178,927, filed on Apr. 23, 2021.

(51) Int. Cl.
*G06F 30/392* (2020.01)
*G06F 30/3953* (2020.01)

(52) U.S. Cl.
CPC ........ *G06F 30/392* (2020.01); *G06F 30/3953* (2020.01)

(58) Field of Classification Search
CPC .................................................. G06F 30/392
USPC ....................................................... 716/137
See application file for complete search history.

(56) References Cited

U.S. PATENT DOCUMENTS

| | | |
|---|---|---|
| 2003/0112595 A1 | 6/2003 | Kwong et al. |
| 2014/0327751 A1 | 11/2014 | King et al. |
| 2016/0174361 A1* | 6/2016 | Chen ........................ H01P 3/026 333/1 |
| 2017/0186141 A1 | 6/2017 | Ha et al. |
| 2018/0176526 A1 | 6/2018 | Sivalingam et al. |

(Continued)

FOREIGN PATENT DOCUMENTS

| | | |
|---|---|---|
| EP | 1 657 779 | 5/2006 |
| EP | 3 163 676 | 5/2017 |
| EP | 3 595 421 | 1/2020 |

OTHER PUBLICATIONS

International Preliminary Report on Patentability and Written Opinion issued Nov. 2, 2023 in International Application No. PCT/US2022/016099.

(Continued)

*Primary Examiner* — Eric D Lee
(74) *Attorney, Agent, or Firm* — WENDEROTH, LIND & PONACK, L.L.P.

(57) ABSTRACT

A robust, reliable, and efficient UHD HDR IP client device, such as a set top box, receives content, for example, from a cable service provider so that the content can be displayed to a compatible display device with improved visual effect. The UHD HDR IP client device PCB design layout comprises a PCB. The PCB includes six layers that maximize the efficiency of the UHD HDR IP client device that includes. The six layers with a design layout that maximizes efficiency and routing provides an improved quality of experience for a user for viewing on a display received 4K or higher content.

20 Claims, 7 Drawing Sheets
(7 of 7 Drawing Sheet(s) Filed in Color)

(56) References Cited

U.S. PATENT DOCUMENTS

| | | |
|---|---|---|
| 2018/0278926 A1 | 9/2018 | Mendenhall et al. |
| 2020/0252687 A1 | 8/2020 | Ryu et al. |
| 2020/0395661 A1 | 12/2020 | Bai et al. |

OTHER PUBLICATIONS

International Preliminary Report on Patentability and Written Opinion issued Nov. 2, 2023 in International Application No. PCT/US2022/016100.

International Search Report and the Written Opinion of the International Searching Authority dated May 10, 2022 in International (PCT) Application No. PCT/US2022/016100.

Arris Group: "DSR830 Satellite Set-Top Box Teardown Internal Photos 170222C39_EUT photo_ ARRIS Group", Dec. 3, 2017 (Dec. 3, 2017), pp. 7-16, XP055915859, Retrieved from the Internet: URL:https://fccid.io/ACQ-DSR830/Internal-Photos/Internal-Photos-pdf-3413252.pdf [retrieved on Apr. 26, 2022] p. 7-p. 14.

International Search Report and the Written Opinion of the International Searching Authority dated May 25, 2022 in International (PCT) Application No. PCT/US2022/016099.

* cited by examiner

UHD HDR IP CLIENT DEVICE PCB DESIGN LAYOUT

BACKGROUND

Users are increasingly expecting to receive content that can be viewed with greater quality and quantity, such as content provided by a cable service provider. Users are expecting to receive content that can be displayed with ultra-high definition (UHD) or 4k, high dynamic range (HDR), or both. Thus, there is a need for a UHD HDR Internet Protocol (IP) client device printed circuit board (PCB) design layout that can receive and process such content.

SUMMARY

According to aspects of the present disclosure there are provided novel solutions for a UHD HDR IP client device design layout, such as a set top box design layout, that allows a UH HDR IP client device to receive content, for example, from a cable service provider so that the content can be displayed to a compatible display device with improved visual effect. For example, UHD provides for an improved resolution while HDR provides for a more intense or greater contrast range. Throughout this disclosure the UHD HDR IP client device PCB design layout may also be referred to as a UHD HDR wireless fidelity (Wi-Fi) client device PCB design layout. The UHD HDR IP client device provides for tuning and decoding of content, for example, the UHD HDR IP client device with the novel PCB design layout can comprise a high definition video decoder that provides for any one or more of HDR (such as HDR 10), advanced HDR (Dolby Vision), HEVC 10-bit 4Kp60, MPEG-4 AVC HP@L3/L4 up to 1080p60, MPEG-2 MP @ML/HL up to 1080p60, and VP9.2 AV1, Motion JPEG, an audio decoder that provides for any one or more of MPEG-1 Layers 2 & 3 (MP3), AAC, HE-AAC, HE-AAC v2, Dolby AC-4, Dolby Digital (AC-3) Dolby Digital Plus (E-AC 3), Dolby Digital Plus with Atmos, Dolby Multistream MS12, L-PCM, and SBC, and/or a still image decoder such as JPEG, GIF, and/or PNG. The UHD HDR IP client device can include one or more interfaces such as a WPS for Wi-Fi pairing (for example, on a bottom portion or panel) and any of a high definition multimedia interface (HDMI) Output 2.1, 10/100 Ethernet, and/or Power Barrel (for example, on a rear portion or panel). The UHD HDR IP client device can include one or more elements to provide connectivity such as Wi-Fi, Dual Band, 2×2 802.11ax, Bluetooth 5.0, IR, ZigBee radio frequency for consumer electronics (RF4CE), any other connectivity and/or protocol, or any combination thereof. In one or more embodiments, the UHD HDR IP client device includes an ARM processor (for example, 15500DMIPS), a flash and TSB (for example, 16 GB embedded multimedia card (eMMC)+), and/or a random access memory (RAM) (for example, 2 gigabytes RAM).

The UHD HDR IP client device PCB design layout utilizes a six layer printed circuit board (PCB). Using a six layer PCB design layout with, for example, a dielectric between each layer, allows for the implementation of a plurality of ground planes power planes, and the disposition of one or more routing traces within any one or more inner layers (such as a third layer and/or a fourth layer) of the six layers to maintain signal integrity. One or more signals associated with one or more routing traces can be surround by a ground plane to prevent interference with the operation of one or more other traces, one or more components of the PCB (such as an antenna and/or Wi-Fi connector), any other element of the UHD HDR IP client device PCB design layout, or any combination thereof. Using a six layer configuration can improve the operation over a four layer configuration given that the traces can be essentially isolated from each other and/or other elements. Additionally, the HDMI connector and associated traces and/or components can be routed interlayer as opposed to at or about an outside of the PCB.

Thus, according to various aspects of the present disclosure described herein, it is possible to provide an improved user experience using a UHD HDR IP client device PCB design layout as discussed herein.

BRIEF DESCRIPTION OF DRAWINGS

In the drawings, like reference numbers generally indicate identical, functionally similar, and/or structurally similar elements. The patent or application file contains seven drawings executed in color. Copies of this patent or patent application publication with color drawing(s) will be provided by the United States Patent and Trademark Office upon request and payment of the necessary fee.

DETAILED DESCRIPTION

The following detailed description is made with reference to the accompanying drawings and is provided to assist in a comprehensive understanding of various example embodiments of the present disclosure. The following description includes various details to assist in that understanding, but these are to be regarded merely as examples and not for the purpose of limiting the present disclosure as defined by the appended claims and their equivalents. The words and phrases used in the following description are merely used to enable a clear and consistent understanding of the present disclosure. In addition, descriptions of well-known structures, functions, and configurations may have been omitted for clarity and conciseness. Those of ordinary skill in the art will recognize that various changes and modifications of the examples described herein can be made without departing from the spirit and scope of the present disclosure.

As discussed herein, a UDH HDR IP client device PCB design layout for a PCB can comprise six layers. The six layer design layout provides for improved signal integrity associated with one or more routing traces. For example, the six layer design layout allows for shorter routing traces especially for those that are susceptible to noise or interference. As discussed herein, one or more shields can also be utilized to prevent high frequency noise from one or more components from interfering with the operation of one or more other components of the PCB and/or one or more routing traces. For example, one or more routing traces or one or more components can interfere with any one or more antennas disposed at or about the PCB and case some performance degradation into the radio frequency (RF) interfaces, such as the wireless Bluetooth antenna and/or an RF4CE antenna. A six layer design layout allows for an inner layer, such as the third layer, to have a ground plane disposed substantially or partially about the third layer. Certain routing traces can be routed such that the third layer ground plane prevents or limits radiation from the certain routing traces so as to prevent or limit interference with one or more other routing traces and/or components of the PCB. In general, routing trace distance is minimized to prevent or limit interference with any one or more other routing traces and/or one or more components of the PCB. While the present disclosure discusses a plurality of layers, such as a six layer design, any number of layers that provides a plurality of inner or middle layers is contemplated.

Figure 1:
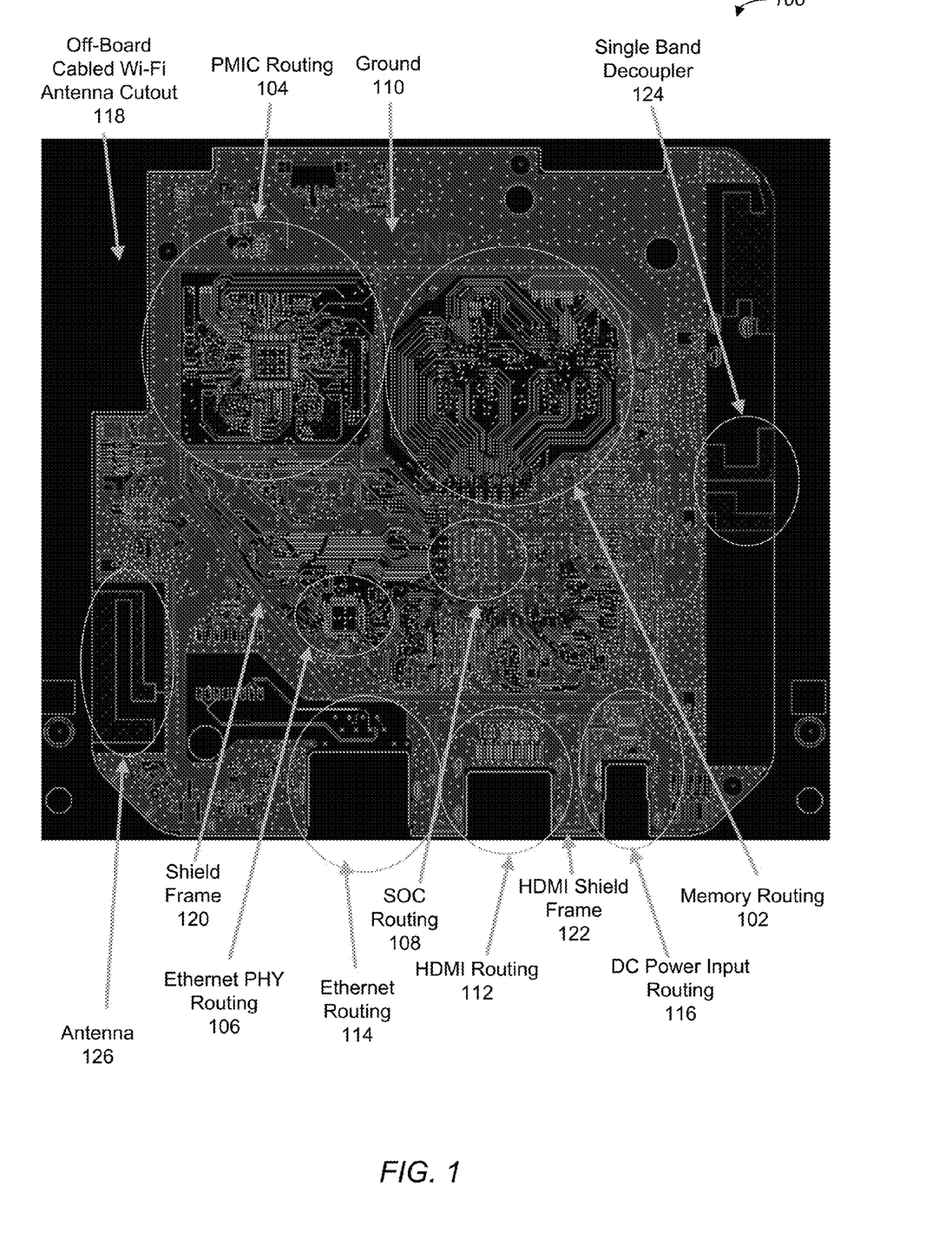
FIG. 1 illustrates a first layer of a UHD HDR IP client device PCB design layout, according to one or more aspects of the present disclosure.

FIG. 1 illustrates a top view of a first layer 100 of a plurality of layers a UHD HDR IP client device PCB design layout, according to one or more aspects of the present disclosure. A ground 110 is disposed about the first layer 100, for example, at or about one or more spaces in between one or more components, one or more routing traces, and/or one or more routing vias of the first layer 100. For example, the ground 110 can be disposed in one or more spaces of the first layer 100 that are free of any component, routing trace, or routing via of the first layer 100.

The first layer 100 includes a power management integrated circuit (PMIC) routing 104. The PMIC routing 104 can be disposed at or about a top left portion of the first layer 100. The PMIC routing 104 comprises one or more PMIC routing traces.

The first layer 100 includes an Ethernet PHY routing 106. The Ethernet PHY routing 106 can be disposed at or about a mid-bottom left portion of the first layer 100. The Ethernet PHY routing 106 comprises one or more Ethernet PHY routing traces.

The first layer 100 includes a surface on chip (SOC) routing 108. The SOC routing 108 can be disposed at or about a center or middle portion of the first layer 100. The SOC routing 108 comprises one or more SOC routing traces.

The first layer 100 includes a memory routing 102. The memory routing 102 can be disposed at or about a top-middle right portion of the first layer 100. The memory routing 102 can comprise one or more routing traces for a dynamic random access memory (DRAM), a flash memory (including, for example, an embedded multimedia car (eMMC)), any other memory, or any combination thereof. While memory routing 102 is illustrated in FIG. 1, the present disclosure contemplates that memory routing will be disposed throughout any of the one or more layers or one or more interlayers to maximize integrity and speed of any one or more signals associated with the memory routing 102. For example, layer transition is minimized for the one or more memory routing 102 and/or any other memory routing of any one or more layers to improve signal integrity. Minimizing layer transition improves high speed signal integrity.

The first layer 100 includes an HDMI routing 112. The HDMI routing 112 can be disposed at or about a bottom middle portion of the first layer 100. The HDMI routing 112 comprises one or more HDMI routing traces. The HDMI routing 112 is disposed close to or within a proximity of the SOC and/or the SOC routing 108 so as to minimize any interference with and/or from the HDMI routing 112. In one or more embodiments, one or more of the one or more routing traces associated with the HDMI routing 112 are routed through a third layer 300 that includes a ground plane 310 as discussed with reference to FIG. 3.

The first layer 100 includes an HDMI shield frame 122 that surrounds all or a portion of the HDMI routing 112. The HDMI shield frame 122 supports a shield that prevents or limits interference with one or more other routing traces and/or components of the PCB from one or more of the one or more HDMI routing 112. The HDMI shield frame 122 can be disposed at or about a bottom middle portion of the first layer 100.

The first layer 100 includes an Ethernet routing 114. The Ethernet routing 114 can be disposed at or about a bottom left portion of the first layer 100. The Ethernet routing 114 comprises one or more Ethernet routing traces.

The first layer 100 includes a direct current (DC) power routing 116. The DC power routing 116 can be disposed at or about a bottom right portion of the first layer 100. The DC power routing 116 comprises one or more DC power routing traces.

The first layer 100 includes an off-board cabled wireless fidelity (Wi-Fi) antenna cutout 118 so as to provide disposition of an off-board cabled Wi-Fi antenna. The off-board cabled Wi-Fi antenna cutout 118 can be disposed at or about an upper left portion of the first layer 100.

The first layer 100 includes a shield frame 120 that forms a perimeter around and/or surrounds at least the PMIC routing 104, the Ethernet PHY routing 106, the memory routing 102, and the SOC routing 108. The shield frame 120 can be disposed at or about a middle left portion of the first layer.

The first layer 100 includes a single band decoupler 124. The single band decoupler 124 can be disposed at or about a middle right portion of the first layer 100. The single band decoupler 124 enhances antenna to antenna isolation between, for example, a Bluetooth antenna and an on-board Wi-Fi antenna.

The first layer 100 includes an antenna 126. Antenna 126 can be an RF4CE 2.4 Gigahertz (GHz) antenna or any other suitable antenna. The antenna 126 can be disposed at or about a portion opposite the off-board cabled Wi-Fi antenna cutout 118, for example, at a bottom left portion of the first layer 118.

Figure 2:
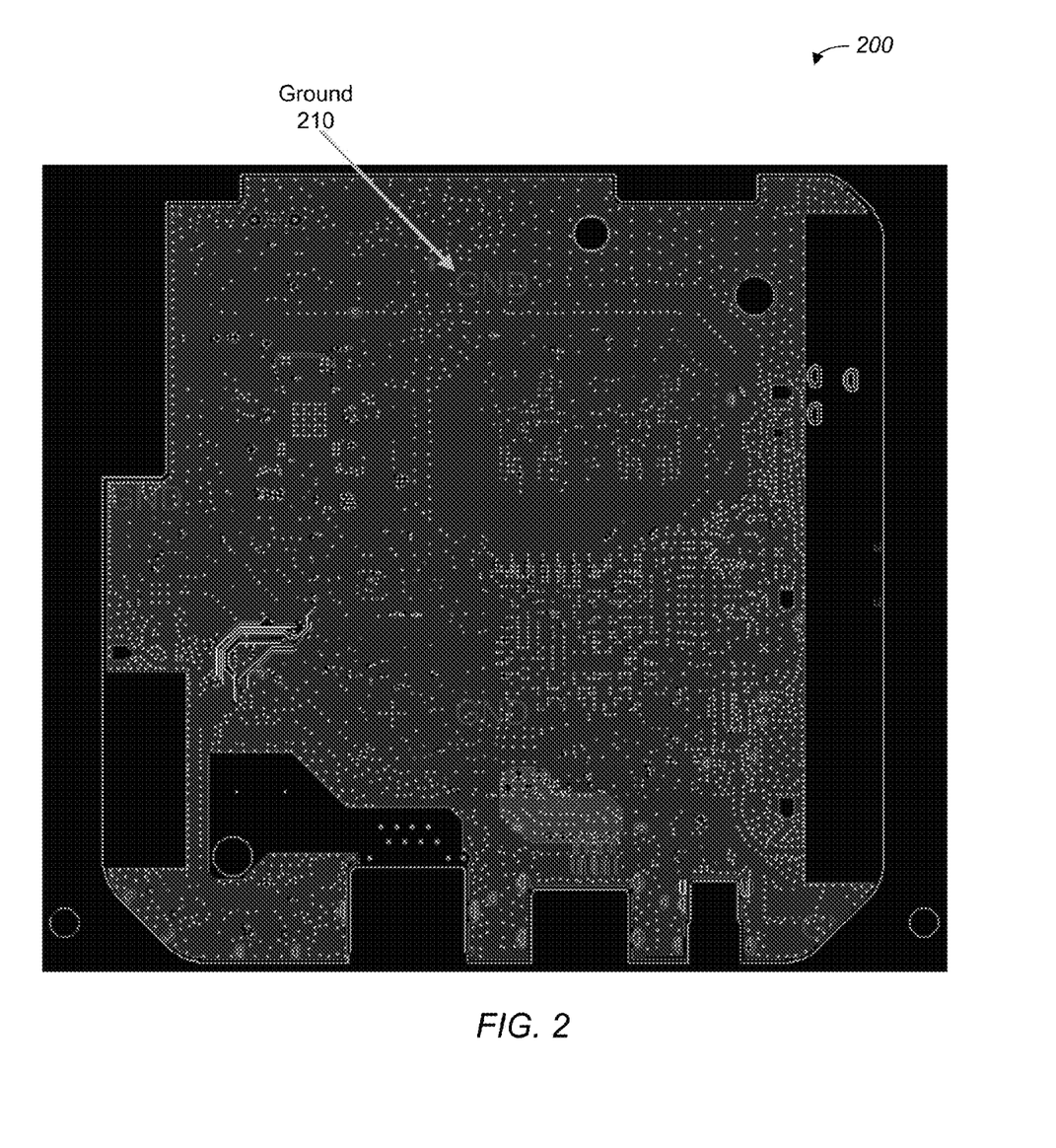
FIG. 2 illustrates a second layer of a UHD HDR IP client device PCB design layout, according to one or more aspects of the present disclosure.

FIG. 2 illustrates a second layer 200 of a UHD HDR IP client device PCB design layout, according to one or more aspects of the present disclosure. A ground 210 is disposed about the second layer 200, for example, at or about one or more free spaces. The one or more free spaces can be any portion of the second layer that does not comprise any other element. For example, the one or more free spaces can be in between one or more components, one or more routing traces, and/or one or more routing vias of the second layer 200. For example, the ground 210 can be disposed in one or more spaces of the second layer 200 that are free of any component, routing trace, and/or routing via of the second layer 200.

Figure 3:
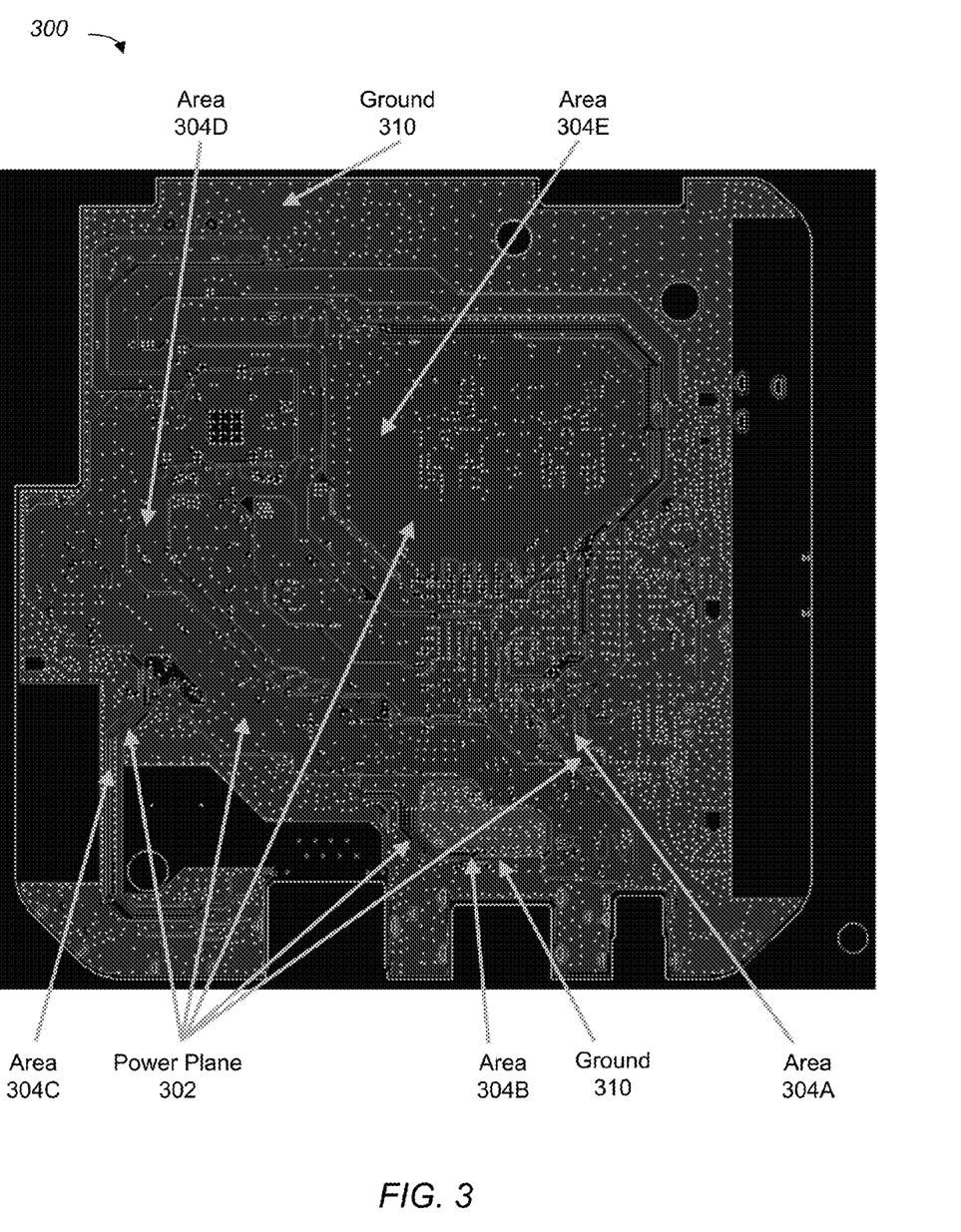
FIG. 3 illustrates a third layer of a UHD HDR IP client device PCB design layout, according to one or more aspects of the present disclosure.

FIG. 3 illustrates a third layer 300 of a UHD HDR IP client device PCB design layout, according to one or more aspects of the present disclosure. A ground 310 is disposed about the third layer 300, for example, at or about one or more spaces in between one or more components, one or more routing traces, and/or one or more routing vias of the third layer 300. For example, the ground 310 can be disposed in one or more spaces of the third layer 300 that are free of any component, routing trace, or routing via of the third layer 300.

The third layer 300 comprises one or more power planes 302 disposed about one or more areas, for example, areas 304A, 304B, 30C, 304D and 304E (collectively referred to as area(s) 304) of the third layer 300. The one or more power planes 302 can be contiguous such that the one or more areas 304 of the third layer 300 are connected via the power plane.

The third layer 300 is an inside layer between a second layer 200 and a fourth layer 400. In this layer any one or more shields are not present. The third layer 300 comprises routing between shields present in one or more other layers. The third layer 300 can be utilized to route one or more routing traces associated with the HDMI routing 112 such that the HDMI routing 112 is surrounded by a ground plane so as to prevent interference with other routing traces or components of the PCB. Routing HDMI routing 112 and/or one or more traces associated with a high speed signal through an inner or inside layer provides for a shorter distance between a source point and a termination point as well as provides for less noise or interference. For example, routing memory traces (such as those associated with a double data rate (DDR) memory) or traces associated with HDMI routing 112 through an inner layer, such as third layer 300, provides signal integrity and reduces the distance required for an associated signal to travel. A six or more layer design with ground planes allows for traces that can cause create noise or cause interference to be routed through inner or middle layers so that these traces not radiate outwards which decreases or eliminates interference with other traces and/or components. A noise prone signal can be routed via a trance through an inner or middle layer such that the trace is surrounded at least partially by a ground plane so as to isolate the associated signal or reduce interference to other components and/or traces by the associated signal. In this way, harmonic distortion or high frequency noise associated with, for example, HDMI routing 112 or memory traces, can be contained so as to eliminate or reduce interference with other traces and/or components.

In one or more embodiments, the third layer 300 comprises a ground plane 310 that is disposed about all or substantially all of the third layer 300 except for one or more routing vias and a minimal number of one or more routing traces. For example, routing one or more HDMI routing traces associated with the HDMI routing 112 through the third layer 300 can isolate the one or more HDMI routing traces such that interference associated with the one or more HDMI routing traces is prevented or substantially prevented.

Figure 4:
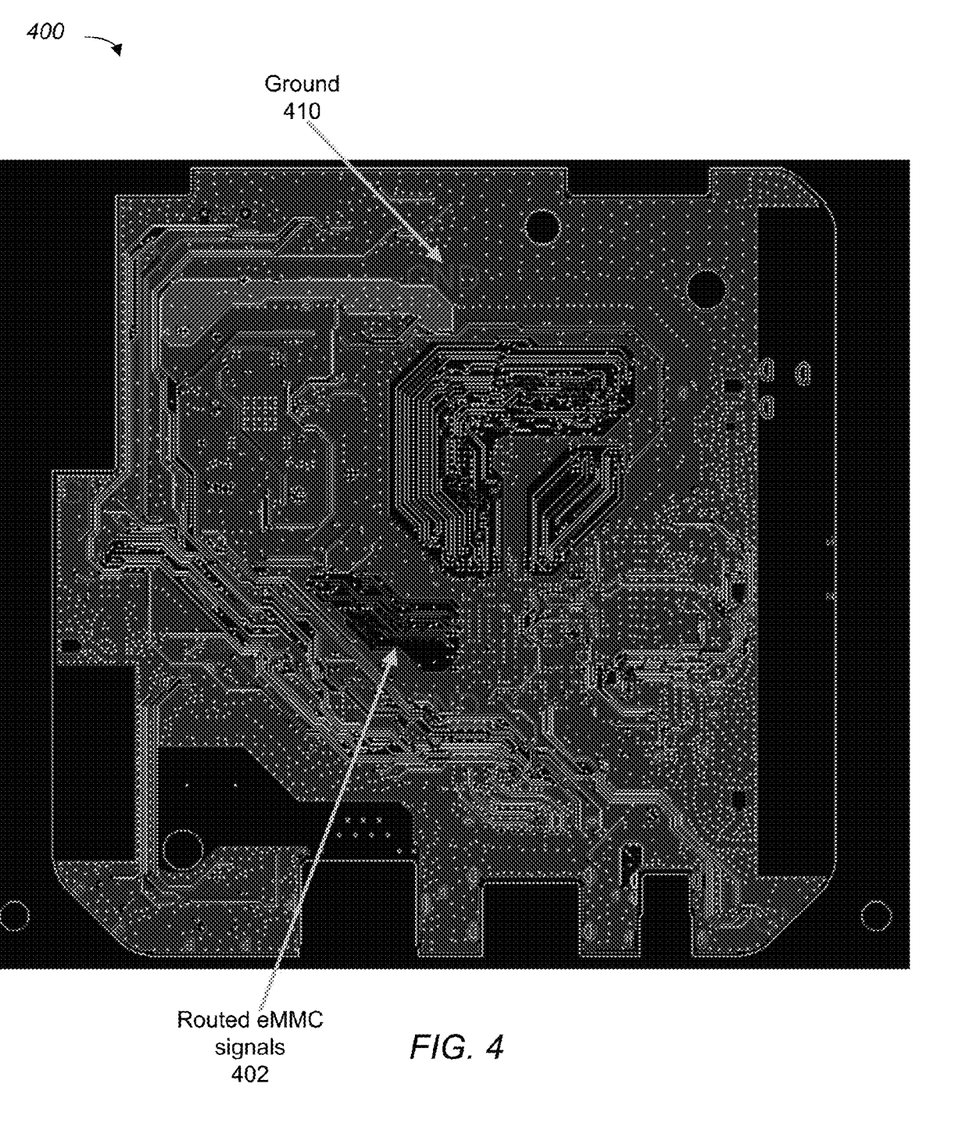
FIG. 4 illustrates a fourth layer of a UHD HDR IP client device PCB design layout, according to one or more aspects of the present disclosure.

FIG. 4 illustrates a fourth layer 400 of a UHD HDR IP client device PCB design layout, according to one or more aspects of the present disclosure. A ground 410 is disposed about the fourth layer 400, for example, at or about one or more spaces in between one or more components, one or more routing traces, and/or one or more routing vias of the fourth layer 400. For example, the ground 410 can be disposed in one or more spaces of the fourth layer 400 that are free of any component, routing trace, or routing via of the fourth layer 400.

The fourth layer 400 comprises one or more routed eMMC signals, for example, routed eMMC signals 402. The one or more routed eMMC signals 402 provide or supply power distribution associated for one or more components disposed about any of the one or more layers discussed herein. For example, a first routed eMMC of the one or more routed eMMC signals 402 can provide a DC voltage of at or about 5 Volts (V), for example to power a memory, while a second power plane of the one or more routed eMMC signals 402 can provide a voltage of at or about 1V to 1.5V, for example, to power a SOC. In one or more embodiments, three or more routed eMMC signals 402 can be implemented to supply power to various types of components of the PCB.

Figure 5:
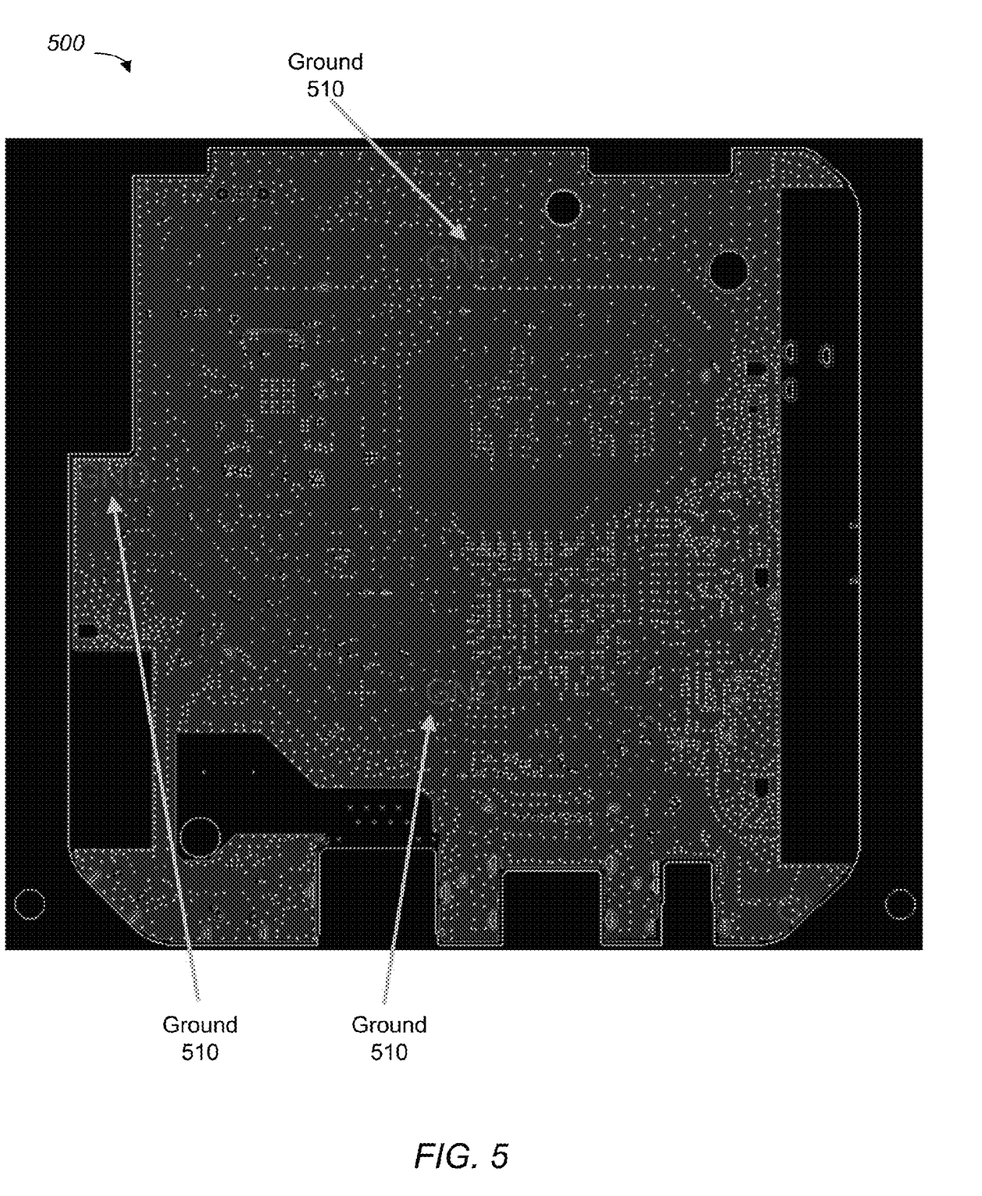
FIG. 5 illustrates a fifth layer of a UHD HDR IP client device PCB design layout, according to one or more aspects of the present disclosure.

FIG. 5 illustrates a fifth layer 500 of a UHD HDR IP client device PCB design layout, according to one or more aspects of the present disclosure. A ground plane 510 is disposed about the fifth layer 500, for example, at or about one or more spaces in between one or more components, one or more routing traces, and/or one or more routing vias of the fifth layer 500. For example, the ground 510 can be disposed in one or more spaces of the fifth layer 500 that are free of any component, routing trace, or routing via of the fifth layer 500.

Figure 6:
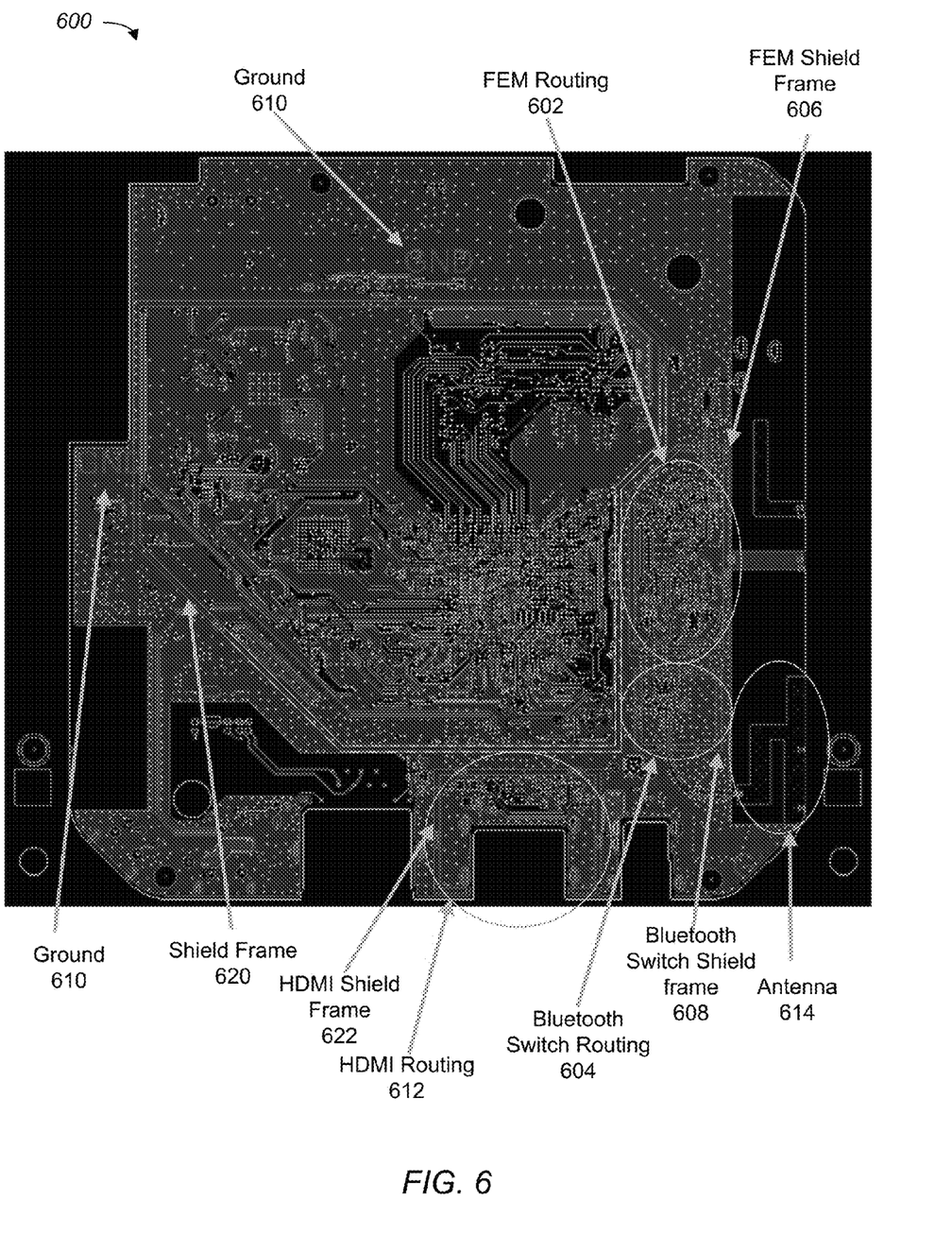
FIG. 6 illustrates a sixth layer of a UHD HDR IP client device PCB design layout, according to one or more aspects of the present disclosure.

FIG. 6 illustrates a sixth layer 600 of a UHD HDR IP client device PCB design layout, according to one or more aspects of the present disclosure. A ground 610 is disposed about the sixth layer 600, for example, at or about one or more spaces in between one or more components, one or more routing traces, and/or one or more routing vias of the sixth layer 600. For example, the ground 610 can be disposed in one or more spaces of the sixth layer 600 that are free of any component, routing trace, or routing via of the sixth layer 600.

The sixth layer comprises a shield frame 620 that surrounds all or a portion of one or more routing and/or traces associated with one or more components as discussed with reference to FIG. 1. The shield frame 620 can be disposed at or about a center portion of the sixth layer 600.

The sixth layer comprises one or more front end module (FEM) routing 602 associated with one or more Wi-Fi antennas at a right middle portion of the sixth layer 600. The FEM routing 602 comprises one or more routing traces.

The sixth layer 600 comprises a Bluetooth switch routing 604 at a bottom right portion of the sixth layer 600. The Bluetooth switch routing 604 comprises one or more Bluetooth switch routing traces.

The sixth layer 600 comprises an FEM shield frame 606 that surrounds all or a portion of the FEM routing 602. The FEM shield frame 606 can be disposed at or about a right middle portion of the sixth layer 600.

The sixth layer 600 comprise a Bluetooth switch shield frame 608 that surrounds all or a portion of the Bluetooth switch routing 604. The Bluetooth switch shield frame can be disposed at or about a bottom right portion of the sixth layer.

The sixth layer 600 comprises an HDMI routing 612 at a bottom middle portion of the sixth layer 600. The HDMI routing 612 comprises one or more HDMI routing traces.

The sixth layer 600 comprises an HDMI shield frame 622 that surrounds all or a portion of the HDMI routing 612. The HDMI shield frame 622 can be disposed at or about a bottom middle portion of the sixth layer 600. The HDMI shield frame 622 aligns with the HDMI shield frame 122.

The sixth layer 600 comprises an antenna 614. Antenna 614 can be disposed at or about a bottom right portion of the sixth layer, for example, at or about an opposite portion or side from the antenna 126 of the first layer. Antenna 614 can include a Bluetooth antenna.

Figure 7:
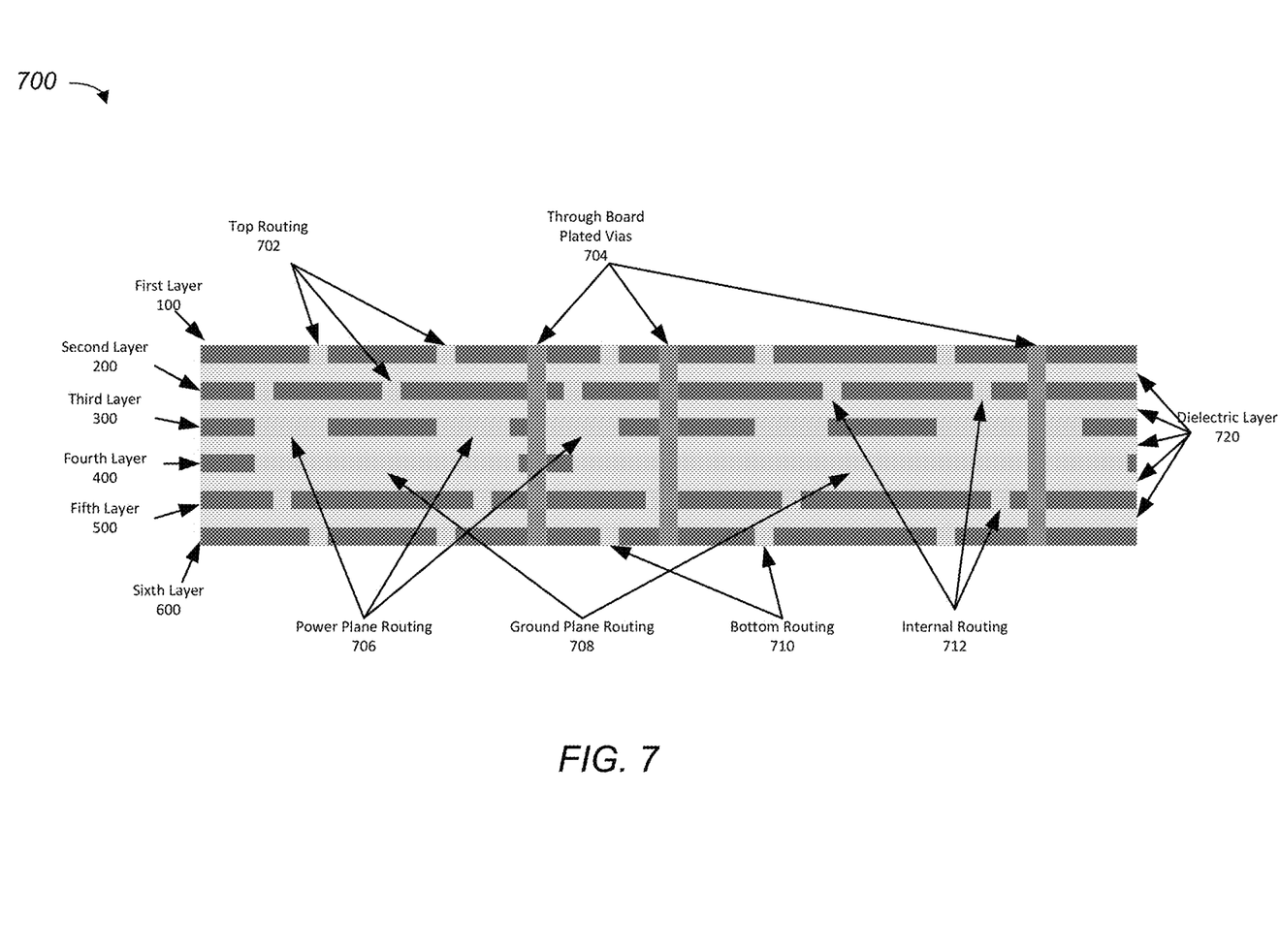
FIG. 7 illustrates a cross-sectional view of a six layer UHD HDR IP client device PCB design layout, according to one or more aspects of the present disclosure.

FIG. 7 illustrates a cross-sectional view of a six layer UHD HDR IP client device PCB design layout, according to one or more aspects of the present disclosure. A layer stack 700 comprises a plurality of layers. The plurality of layers comprises a dielectric layer 720 disposed between two layers of the plurality of layers so as to separate each layer from each other. For example, a first dielectric layer 720 is disposed between the first layer 100 and the second layer 200, a second dielectric layer 720 is disposed between the second layer 200 and the third layer 300, a third dielectric layer 720 is disposed between the third layer 300 and the fourth layer 400, a fourth dielectric layer is disposed between the fourth layer 400 and the fifth layer 500, and a fifth dielectric layer 720 is disposed between the fifth layer and the sixth layer 600. Each of the plurality of layers (such as layers 100-600 and dielectric layer 702) is bonded or otherwise adhered to a at least one other layer so as to form the layer stack 700.

The first layer 100, the second layer or both comprise a top routing 702. The second layer 200, the fifth layer 500 or both comprise an internal routing 712. The third layer 300 comprises a power plane routing 706. The fourth layer 400 comprises a ground plane routing 708. The sixth layer 600 comprises a bottom routing 710. One or more through board plated vias 704 extend from a first layer 100 through the second layer 200, the third layer 300, the fourth layer 400, the fifth layer 500, and the sixth layer 600 including all dielectric layers 702.

While one or more figures include circular or ovular indicators associated with one or more routing traces, the present disclosure contemplates that these indicators are for ease of identification of an area, for example, an indication of a general area or portion of the layer, and that one or more routing traces associated with a label can be disposed partially within or outside the indicator.

The word "comprise" or a derivative thereof, when used in a claim, is used in a nonexclusive sense that is not intended to exclude the presence of other elements or steps in a claimed structure or method. As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise. Use of the phrases "capable of," "configured to," or "operable to" in one or more embodiments refers to some apparatus, logic, hardware, and/or element designed in such a way to enable use thereof in a specified manner.

While the principles of the inventive concepts have been described above in connection with specific devices, apparatuses, systems, algorithms, programs and/or methods, it is to be clearly understood that this description is made only by way of example and not as limitation. The above description illustrates various example embodiments along with examples of how aspects of particular embodiments may be implemented and are presented to illustrate the flexibility and advantages of particular embodiments as defined by the following claims, and should not be deemed to be the only embodiments. One of ordinary skill in the art will appreciate that based on the above disclosure and the following claims, other arrangements, embodiments, implementations and equivalents may be employed without departing from the scope hereof as defined by the claims. It is contemplated that the implementation of the components and functions of the present disclosure can be done with any newly arising technology that may replace any of the above-implemented technologies. Accordingly, the specification and figures are to be regarded in an illustrative rather than a restrictive sense, and all such modifications are intended to be included within the scope of the present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What we claim is:

1. A plurality of layers of an ultra-high definition (UHD) high dynamic range (HDR) Internet Protocol (IP) client device, comprising:
    a first layer of the plurality of layers, wherein the first layer comprises:
        an off-board cabled Wi-Fi antenna cutout disposed at an upper left portion of the first layer;
        a first antenna disposed opposite the off-board cabled Wi-Fi antenna cutout;
        a single band decoupler disposed at or about a middle right portion of the first layer; and
        a first high definition multimedia interface (HDMI) shield frame disposed at or about a bottom middle portion of the first layer, wherein the first HDMI shield frame surrounds all or a portion of a first HDMI routing;
    a second layer of the plurality of layers, wherein the second layer comprises:
        a ground disposed about the second layer at or about one or more free spaces;
    a first dielectric layer of the plurality of layers disposed between the first layer and the second layer;
    a third layer of the plurality of layers, wherein the third layer comprises:
        one or more power planes disposed about one or more areas of the third layer;
    a second dielectric layer of the plurality of layers disposed between the second layer and the third layer;
    a fourth layer of the plurality of layers, wherein the fourth layer comprises:
        one or more routed embedded multimedia card (eMMC) signals;
    a third dielectric layer of the plurality of layers disposed between the third layer and the fourth layer;
    a fifth layer of the plurality of layers, wherein the fifth layer comprises:
        a ground plane disposed about the fifth layer;
    a fourth dielectric layer of the plurality of layers disposed between the fourth layer and the fifth layer;
    a sixth layer of the plurality of layers, wherein the sixth layer comprises:
        a shield frame disposed at or about a center portion of the sixth layer, wherein the shield frame surrounds all or a portion of one or traces associated with one or more components;
        a front end module (FEM) shield frame disposed at or about a middle right portion of the sixth layer, wherein the FEM shield frame surrounds all or a portion of an FEM routing;
        a Bluetooth switch shield disposed at or about a bottom right portion of the sixth layer, wherein the Bluetooth switch shield surrounds all or a portion of a Bluetooth switch routing;
        a second HDMI shield frame disposed at or about a bottom middle portion of the sixth layer, wherein the second HDMI shield frame surrounds all or a portion of a second HDMI routing; and
        a second antenna disposed at or about a bottom right portion of the sixth layer, wherein the second antenna is at an opposition portion from the first antenna; and a fifth dielectric layer of the plurality of layers disposed between the fifth layer and the sixth layer.

2. The plurality of layers of the UHD HDR IP client device of claim 1, wherein the first HDMI routing is disposed at or about a bottom middle portion of the first layer, and wherein the first HDMI routing comprises one or more HDMI routing traces, and wherein one or more of the one or more HDMI routing traces are routed through the third layer.

3. The plurality of layers of the UHD HDR IP client device of claim 1, wherein the one or more power planes are contiguous such that the one or more areas are connected via the one or more power planes.

4. The plurality of layers of the UHD HDR IP client device of claim 1, wherein the third layer comprises routing between one or more shields of one or more other layers.

5. The plurality of layers of the UHD HDR IP client device of claim 1, wherein the sixth layer comprises a second HDMI routing, wherein the second HDMI shield frame surrounds all or a portion of the second HDMI routing.

6. The plurality of layers of the UHD HDR IP client device of claim 1, wherein the first layer, the second layer or both comprise a top routing, wherein the second layer, the fifth layer or both comprise an internal routing, wherein the third layer comprises a power plane routing, wherein the fourth layer comprises a ground plane routing, and wherein the sixth layer comprises a bottom routing.

7. The plurality of layers of the UHD HDR IP client device of claim 1, wherein one or more through board plated vias extend from the first layer through the second layer, the third layer, the fourth layer, the fifth layer, the sixth layer, the first dielectric layer, the second dielectric layer, the third dielectric layer, the fourth dielectric layer, and a fifth dielectric layer.

8. The plurality of layers of the UHD HDR IP client device of claim 1, wherein the first layer comprises a single band decoupler, the single band decoupler enhances antenna to antenna isolation.

9. The plurality of layers of the UHD HDR IP client device of claim 1, wherein the first antenna is an RF4CE 2.4 Gigahertz antenna.

10. The plurality of layers of the UHD HDR IP client device of claim 1, wherein the first layer comprises an Ethernet routing disposed at or about a bottom left portion of the first layer, a direct current (DC) power routing disposed at or about a bottom right portion of the first layer, or both.

11. A method for configuring an ultra-high definition (UHD) high dynamic range (HDR) Internet Protocol (IP) client device using a plurality of layers, the method comprising:

disposing an off-board cabled Wi-Fi antenna cutout at an upper left portion of a first layer of the plurality of layers;

disposing a first antenna opposite the off-board cabled Wi-Fi antenna cutout;

disposing a single band decoupler at or about a middle right portion of the first layer;

disposing a first high definition multimedia interface (HDMI) shield frame at or about a bottom middle portion of the first layer, wherein the first HDMI shield frame surrounds all or a portion of a first HDMI routing;

disposing a ground about a second layer of the plurality of layers at or about one or more free spaces;

disposing a first dielectric layer of the plurality of layers between the first layer and the second layer;

disposing one or more power planes about one or more areas of a third layer of the plurality of layers;

disposing a second dielectric layer of the plurality of layers between the second layer and the third layer;

disposing one or more routed embedded multimedia card (eMMC) signals about a fourth layer of the plurality of layers;

disposing a third dielectric layer of the plurality of layers disposed between the third layer and the fourth layer;

disposing a ground plane about a fifth layer of the plurality of layers;

disposing a fourth dielectric layer of the plurality of layers between the fourth layer and the fifth layer;

disposing a shield frame disposed at or about a center portion of a sixth layer of the plurality of layers, wherein the shield frame surrounds all or a portion of one or traces associated with one or more components;

disposing a front end module (FEM) shield frame at or about a middle right portion of the sixth layer, wherein the FEM shield frame surrounds all or a portion of an FEM routing;

disposing a Bluetooth switch shield at or about a bottom right portion of the sixth layer, wherein the Bluetooth switch shield surrounds all or a portion of a Bluetooth switch routing;

disposing a second HDMI shield frame at or about a bottom middle portion of the sixth layer, wherein the HDMI shield frame surrounds all or a portion of a second HDMI routing; and disposing a second antenna disposed at or about a bottom right portion of the sixth layer, wherein the second antenna is at an opposition portion from the first antenna; and disposing a fifth dielectric layer of the plurality of layers between the fifth layer and the sixth layer.

12. The method of claim 11, wherein the first HDMI routing is disposed at or about a bottom middle portion of the first layer, and wherein the first HDMI routing comprises one or more HDMI routing traces, and wherein one or more of the one or more HDMI routing traces are routed through the third layer.

13. The method of claim 11, wherein the one or more power planes are contiguous such that the one or more areas are connected via the one or more power planes.

14. The method of claim 11, wherein the third layer comprises routing between one or more shields of one or more other layers.

15. The method of claim 11, wherein the sixth layer comprises a second HDMI routing, wherein the second HDMI shield frame surrounds all or a portion of the second HDMI routing.

16. The method of claim 11, wherein the first layer, the second layer or both comprise a top routing, wherein the second layer, the fifth layer or both comprise an internal routing, wherein the third layer comprises a power plane routing, wherein the fourth layer comprises a ground plane routing, and wherein the sixth layer comprises a bottom routing.

17. The method of claim 11, wherein one or more through board plated vias extend from the first layer through the second layer, the third layer, the fourth layer, the fifth layer, the sixth layer, the first dielectric layer, the second dielectric layer, the third dielectric layer, the fourth dielectric layer, and a fifth dielectric layer.

18. The method of claim 11, wherein the first layer comprises a single band decoupler, the single band decoupler enhances antenna to antenna isolation.

19. The method of claim 11, wherein the first antenna is an RF4CE 2.4 Gigahertz antenna.

20. The method of claim 11, wherein the first layer comprises an Ethernet routing disposed at or about a bottom left portion of the first layer, a direct current (DC) power routing disposed at or about a bottom right portion of the first layer, or both.

* * * * *